United States Patent
Okamoto et al.

(10) Patent No.: US 8,568,534 B2
(45) Date of Patent: *Oct. 29, 2013

(54) METHOD FOR WASHING DEVICE SUBSTRATE

(75) Inventors: Hidekazu Okamoto, Chiyoda-ku (JP); Hideo Namatsu, Shinjuku-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 56 days.

This patent is subject to a terminal disclaimer.

(21) Appl. No.: 13/303,599

(22) Filed: Nov. 23, 2011

(65) Prior Publication Data

US 2012/0067379 A1    Mar. 22, 2012

Related U.S. Application Data

(63) Continuation of application No. 12/233,669, filed on Sep. 19, 2008, now Pat. No. 8,143,203, which is a continuation of application No. PCT/JP2007/057497, filed on Apr. 3, 2007.

(30) Foreign Application Priority Data

Apr. 5, 2006    (JP) ................................ 2006-104187

(51) Int. Cl.
*G03F 7/30*    (2006.01)
*H01L 21/033*    (2006.01)

(52) U.S. Cl.
CPC ................................. *H01L 21/0337* (2013.01)
USPC ....................................................... 134/1.3

(58) Field of Classification Search
USPC ....................................................... 134/1.3
See application file for complete search history.

(56) References Cited

U.S. PATENT DOCUMENTS

| 6,759,176 B2* | 7/2004 | Iwai et al. ................... 430/270.1 |
| 7,385,021 B2* | 6/2008 | Hamada et al. ................. 528/12 |
| 7,741,009 B2* | 6/2010 | Dazai et al. ................. 430/270.1 |
| 7,846,637 B2* | 12/2010 | Ishizuka et al. ............ 430/270.1 |
| 7,932,013 B2* | 4/2011 | Matsumaru et al. ........ 430/270.1 |
| 8,124,312 B2* | 2/2012 | Ishikawa et al. ........... 430/270.1 |
| 8,143,203 B2* | 3/2012 | Okamoto et al. ............. 510/175 |
| 8,227,169 B2* | 7/2012 | Kawaue et al. ............ 430/270.1 |
| 2005/0003977 A1 | 1/2005 | Itano et al. |
| 2005/0164127 A1 | 7/2005 | Reid et al. |
| 2005/0277755 A1* | 12/2005 | Hamada et al. ................. 528/32 |
| 2007/0003864 A1 | 1/2007 | Wagner et al. |
| 2009/0029284 A1* | 1/2009 | Matsumaru et al. ........ 430/270.1 |
| 2009/0029894 A1* | 1/2009 | Okamoto et al. ............. 510/176 |
| 2009/0269706 A1* | 10/2009 | Mimura et al. ................. 430/325 |
| 2010/0035177 A1* | 2/2010 | Ishikawa et al. ........... 430/270.1 |
| 2012/0067379 A1* | 3/2012 | Okamoto et al. ............... 134/26 |

FOREIGN PATENT DOCUMENTS

| CN | 1662637 A | 8/2005 |
| JP | 08-181050 | 7/1996 |
| JP | 10-260537 | 9/1998 |
| JP | 2003-513342 | 4/2003 |
| JP | 2003-206497 | 7/2003 |
| JP | 2003-282518 | 10/2003 |
| JP | 2004-75910 | 3/2004 |
| JP | 2006-40969 | 2/2006 |

OTHER PUBLICATIONS

Office Action issued Mar. 22, 2011, in Chinese Patent Application No. 200780012237.X (with English translation).
International Search Report issued May 5, 2007, in PCT/JP2007/057497, filed Apr. 3, 2007.

* cited by examiner

*Primary Examiner* — Gregory Webb
(74) *Attorney, Agent, or Firm* — Oblon, Spivak, McClelland, Maier & Neustadt, L.L.P.

(57) ABSTRACT

The present invention provides a washing method for a device substrate, capable of sufficiently removing a resist attached to a device substrate, particularly a resist attached to fine pore portions of a pattern having a large aspect ratio.

A method for washing a device substrate, which comprises a washing step of removing a resist attached to a device substrate by means of a solvent, wherein the solvent is a composition comprising at least one fluorinated compound selected from the group consisting of a hydrofluoroether, a hydrofluorocarbon and a perfluorocarbon, and a fluorinated alcohol.

20 Claims, No Drawings

METHOD FOR WASHING DEVICE SUBSTRATE

CROSS REFERENCE TO RELATED APPLICATION

This application is a divisional application of U.S. application Ser. No. 12/233,669, filed on Sep. 19, 2008, now U.S. Pat. No. 8,143,203, which is a continuation of PCT/JP07/057,497, filed on Apr. 3, 2007, and claims priority to Japanese Patent Application No. 2006-104187, filed on Apr. 5, 2006.

TECHNICAL FIELD

The present invention relates to a method for washing a device substrate.

BACKGROUND ART

In large scale integrated circuits (LSI) or micro electro mechanical systems (MEMS), a device preparation process is carried out by repeating formation of a thin film and formation of a pattern. Such a pattern is a resist pattern formed via exposure, development and washing (rinsing) or an etching pattern formed via etching and washing.

A resist to be used in the device preparation process is a polar polymer material sensitive to light, X-ray, electron ray, etc., and will be removed after etching. The resist remains at a pattern portion even after development or etching treatment, and the resist is in a state embedded in pore portions of a pattern. Further, in a case where a low dielectric constant film is formed on the surface of a wafer, and a resist is applied thereon, the resist may sometimes penetrate into fine pores of the low dielectric constant film. Therefore, in washing a device substrate, it is necessary to remove a resist penetrated into such fine pores of a pattern or fine pores of a low dielectric constant film.

In washing to carry out removal of such a resist, an acid solution composed mainly of sulfuric acid or the like, has been used as a wash solution. However, such a wash solution has a large surface tension and can not be penetrated into fine pores of a pattern having a large aspect ratio (height/width), whereby there has been a problem that a resist remains in the pores of a pattern even after the washing.

On the other hand, an ashing technique by means of an oxygen gas plasma has become a prospective means to remove a resist in recent years, since it is free from a problem of a waste liquid, and the gas will diffuse into the interior of a fine structure.

However, in a case where a pattern to be formed is made of an organic material, it is difficult to employ such an ashing technique for removal of a resist.

For example, in LSI, as a material to be used for an interlayer insulating layer of a multilayer wiring structure, a low dielectric material such as a porous methylpolysiloxane or a hydrated polysiloxane has been used to lower the wiring capacity along with the high speed of a semiconductor devices. However, if such an interlayer insulating layer is masked with a resist pattern and subjected to etching and then ashing is carried out to remove the resist pattern, there is a problem such that methyl groups or hydrogen constituting the interlayer insulating film will also be removed by ashing, whereby the dielectric constant will increase.

As a method for solving such a problem, a washing method has been proposed wherein a supercritical fluid having both a gas diffusion property and a liquid-dissolving property is used as a wash solution (e.g. Patent Document 1). By such treatment employing a supercritical fluid, carbon dioxide has heretofore been used as the supercritical fluid.

In the above-mentioned treatment employing a supercritical fluid, a substrate having a resist or the like remaining thereon, is placed in a high pressure resistant container, and carbon dioxide in a supercritical state is introduced into such a high pressure resistant container, so that carbon dioxide in a supercritical state will act on the substrate. The supercritical fluid has a small surface tension and a large diffusion coefficient, whereby it can easily be penetrated even in fine spaces and thus has a possibility of capable of removing a resist between patterns.

However, carbon dioxide does not have a dipole moment, and a resist made of polar molecules can not substantially be dissolved therein. Thus, by the conventional method employing a supercritical fluid, it was not possible to sufficiently remove the resist.

The following two methods have been proposed as methods to solve the above-mentioned problem in the washing method employing a supercritical fluid.

The first method is a method wherein a wash solution is used to dissolve the resist, followed by replacing it with carbon dioxide in a supercritical state (Patent Documents 2 and 3).

The second method is a method wherein an assisting agent such as an amine, an alcohol or glycol ether is employed in carbon dioxide (Patent Document 4).

Further, Patent Document 5 discloses, as a process for carrying out supercritical treatment at a lower pressure, "a supercritical treating process comprising at least a first step of bringing a prescribed pattern on a substrate in a state immersed in a liquid of a fluoride under the atmospheric pressure, a second step of disposing the substrate in a space sealed and maintained to have a constant volume in a state where the above pattern is immersed in the above liquid, a third step of heating the liquid in which the above pattern is immersed to bring the above liquid to a supercritical state and to make the above pattern in such a state as immersed in the supercritical fluid of the above fluoride, and a fourth step of evaporating the supercritical fluid in which the above pattern is immersed, wherein in the third step, the pressure in the above space is brought to the critical pressure of the fluoride by an increase of a gas of the fluoride heated and vaporized". It is disclosed that the fluoride to be used for this supercritical treating method is preferably at least one of a hydrofluoroether and a hydrofluoroester.

On the other hand, the present inventors have previously proposed an azeotropic solvent composition comprising 89 mass % of 1,1,2,2-tetrafluoro-1-(2,2,2-trifluoroethoxy) ethane and 11 mass % of 2,2,2-trifluoroethanol, as a novel solvent composition which is non-flammable, excellent in a dissolving power and useful for a wide range of applications (Patent Document 6).

Patent Document 1: JP-A-08-181050
Patent Document 2: JP-A-10-260537
Patent Document 3: JP-A-2003-206497
Patent Document 4: JP-A-2003-513342
Patent Document 5: JP-A-2006-40969
Patent Document 6: JP-A-2004-75910

DISCLOSURE OF THE INVENTION

Problems to be Solved by the Invention

However, in the method disclosed in the Patent Document 2 or 3, a conventional wash solution is used to dissolve the resist, whereby the resist deposited in fine spaces or fine pores can not adequately be removed.

Further, by the method disclosed in Patent Document 4, no adequate dissolving performance was obtainable depending upon the type of the resist, and it was difficult to accomplish adequate washing in a short time. Particularly by this method, it was difficult to remove an acrylic resin type resist (ArF resist) sensitive to argon fluoride (ArF) laser.

By the supercritical treating process disclosed in Patent Document 5, a resist made of polar molecules can not substantially be dissolved, and it was not possible to sufficiently remove the resist.

On the other hand, Patent Document 6 discloses that the azeotropic solvent composition disclosed in Patent Document 6 is useful for removing stains of e.g. oil, flux or dusts, but discloses nothing about its excellent performance to dissolve a resist or its usefulness for removal of a resist.

Further, heretofore, no method has been known wherein a fluorinated solvent is used for removal of a resist.

It is an object of the present invention to provide a method for washing a device substrate, capable of sufficiently removing a resist attached to a device substrate, particularly a resist attached to fine pore portions of a pattern having a large aspect ratio.

Means to Solve the Problems

The present inventors have found it possible to sufficiently remove a resist attached to a device substrate, particularly a resist attached to fine pore portions of a pattern having a large aspect ratio, by using a composition comprising at least one fluorinated compound selected from the group consisting of a hydrofluoroether, a hydrofluorocarbon and a perfluorocarbon, and a fluorinated alcohol, and thus have accomplish the present invention.

Namely, the present invention provides the following (1) to (14):

(1) A method for washing a device substrate, which comprises a washing step of removing a resist attached to a device substrate by means of a solvent, wherein the solvent is a composition comprising at least one fluorinated compound selected from the group consisting of a hydrofluoroether, a hydrofluorocarbon and a perfluorocarbon, and a fluorinated alcohol.

(2) The method for washing a device substrate according to the above (1), wherein the resist is an acrylic resin-type ArF resist.

(3) The method for washing a device substrate according to the above (1) or (2), wherein the fluorinated compound is a hydrofluoroether.

(4) The method for washing a device substrate according to the above (3), wherein the hydrofluoroether is 1,1,2,2-tetrafluoro-1-(2,2,2-trifluoroethoxy)ethane.

(5) The method for washing a device substrate according to any one of the above (1) to (4), wherein the fluorinated alcohol is a compound of the following formula (1):

$$C_a H_b F_d X_e OH \tag{1}$$

wherein X is a halogen atom other than a fluorine atom, each of a and d is an integer of at least 1, and each of b and e is an integer of at least 0, provided that b+d+e=2a+1.

(6) The method for washing a device substrate according to the above (5), wherein the fluorinated alcohol is 2,2,2-trifluoroethanol.

(7) The method for washing a device substrate according to any one of the above (1) to (6), wherein the content of the fluorinated alcohol is from 1 to 60 mass % in the composition.

(8) The method for washing a device substrate according to the above (1), wherein the solvent is a composition comprising 1,1,2,2-tetrafluoro-1-(2,2,2-trifluoroethoxy)ethane and 2,2,2-trifluoroethanol, wherein the mass ratio of the 1,1,2,2-tetrafluoro-1-(2,2,2-trifluoroethoxy)ethane to the 2,2,2-trifluoroethanol is from 70/30 to 95/5.

(9) The method for washing a device substrate according to the above (8), wherein the mass ratio of the 1,1,2,2-tetrafluoro-1-(2,2,2-trifluoroethoxy)ethane to the 2,2,2-trifluoroethanol is 89/11.

(10) The method for washing a device substrate according to the above (1), wherein the solvent is a composition comprising 1,1,2,2-tetrafluoro-1-(2,2,2-trifluoroethoxy)ethane and 2,2,3,3-tetrafluoropropanol.

(11) The method for washing a device substrate according to the above (1), wherein the solvent is a composition comprising 1,1,2,2-tetrafluoro-1-(2,2,2-trifluoroethoxy)ethane and 2,2,3,3,4,4,5,5-octafluoropentanol.

(12) The method for washing a device substrate according to any one of the above (1) to (11), wherein the solvent is used in a supercritical state.

(13) The method for washing a device substrate according to any one of the above (1) to (11), wherein in the washing step, washing is carried out by using the solvent in a liquid state, and then washing is carried out by using the solvent in a supercritical state.

(14) The method for washing a device substrate according to any one of the above (1) to (13), which includes, after the washing step, a rinsing step of carrying out rinsing by means of the above solvent or a hydrofluoroether.

Effects of the Invention

The method for washing a device substrate of the present invention is capable of sufficiently removing a resist attached to a device substrate, particularly a resist attached to fine pore portions of a pattern having a large aspect ratio.

BEST MODE FOR CARRYING OUT THE INVENTION

Now, the present invention will be described in further detail.

The method for washing a device substrate of the present invention (hereinafter referred to also as "the washing method of the present invention") is a method for washing a device substrate, which comprises a washing step of removing a resist attached to a device substrate by means of a solvent, wherein the solvent is a composition comprising at least one fluorinated compound selected from the group consisting of a hydrofluoroether, a hydrofluorocarbon and a perfluorocarbon, and a fluorinated alcohol.

Firstly, the solvent to be used for the washing method of the present invention will be described in detail.

The solvent to be used for the washing method of the present invention is a composition comprising at least one fluorinated compound selected from the group consisting of a hydrofluoroether, a hydrofluorocarbon and a perfluorocarbon, and a fluorinated alcohol.

The above fluorinated compound is selected from the group consisting of a hydrofluoroether, a hydrofluorocarbon and a perfluorocarbon. The above fluorinated compound is preferably a hydrofluoroether or a hydrofluorocarbon, more preferably a hydrofluoroether, from such a viewpoint that the greenhouse effect is relatively low, and the influence to the environment is little.

Specifically, the hydrofluoroether may, for example, be methyl perfluorobutyl ether, ethyl perfluorobutyl ether, 1,1,1,2,3,4,4,5,5,5-decafluoro-2-(trifluoromethyl)-3-(methoxy) pentane, 1,1,1,2,3,4,4,5,5,5-decafluoro-2-(trifluoromethyl)-3-(ethoxy)pentane, 1,1,2,2-tetrafluoro-1-(2,2,2-trifluoroethoxy)ethane, 1,1,2,3,3,3-hexafluoro-1-(2,2,2-trifluoroethoxy)propane, 1,1,2,2-tetrafluoro-1-(2,2,3,3-tetrafluoropropoxy)ethane or 1,1,2,3,3,3-hexafluoro-1-(2,2,3,3-tetrafluoropropoxy)propane. They may be used alone or in combination as a mixture of two or more of them.

Among them, 1,1,2,2-tetrafluorol-(2,2,2-trifluoroethoxy) ethane is preferred from such a viewpoint that it can be brought to a supercritical state at a relatively low temperature.

Specifically, the above hydrofluorocarbon may, for example, be 1,1,1,3,3-pentafluorobutane, 1,1,1,2,2,3,4,5,5,5-decafluoropentane, 1,1,2,2,3,3,4-heptafluorocyclopentane, 1H-tridecafluorohexane, 1,1,1,2,2,3,3,4,4-nonafluorohexane or 1,1,1,2,2,3,3,4,4,5,5,6,6-tridecafluorooctane. They may be used alone or in combination as a mixture of two or more of them.

The above perfluorocarbon may, for example, be a compound having all hydrogen atoms of a linear, branched or cyclic $C_{5-15}$ hydrocarbon substituted by fluorine atoms (an entirely fluorinated hydrocarbon), a compound having all hydrogen atoms in an alkyl group of a linear, branched or cyclic $C_{5-15}$ alkylamine substituted by fluorine atoms (an entirely fluorinated alkylamine) or a compound having all hydrogen atoms in a linear, branched or cyclic $C_{5-15}$ alkylether substituted by fluorine atoms (an entirely fluorinated alkylether).

Specifically, FLUORINERT (registered trademark) FC-87, 72, 84, 77, 3255, 3283, 40, 43, 70, etc. sold by Sumitomo 3M Limited, GALDEN (registered trademark) HT-55, 70, 90, 110, 135, 170, 200, 230, 270, etc. sold by Ausimont Inc. or Full tech (registered trademark) PP-50, 1, 2, 3, 6, 9, 10, 11, etc. sold by F2 chemical company, may, for example, be mentioned. They may be used alone or in combination as a mixture of two or more of them.

The above fluorinated alcohol means a compound having a fluorine atom and a hydroxyl group.

As the above fluorinated alcohol, a compound of the following formula (1) may, for example, be preferably mentioned.

$$C_aH_bF_dX_eOH \quad (1)$$

In the above formula (1), X is a halogen atom (Cl, Br or I) other than a fluorine atom, preferably a chlorine atom (Cl).

Each of a and d is an integer of at least 1, and a is preferably an integer of from 2 to 7, and d is preferably an integer of from 2 to 13.

Each of b and e is an integer of at least 0, and b is preferably an integer of from 2 to 10 and e is preferably 0.

Further, $b+d+e=2a+1$.

Specifically, the above fluorinated alcohol may, for example, be 2,2,2-trifluoroethanol, 2,2,3,3,3-pentafluoropropanol, 2,2,3,3-tetrafluoropropanol, 2,2,3,4,4,4-hexafluorobutanol, 2,2,2-trifluoro-1-(trifluoromethyl)ethanol or 2,2,3,3,4,4,5,5-octafluoropentanol. They may be used alone or in combination as a mixture of two or more of them.

Among them, 2,2,2-trifluoroethanol, 2,2,3,3-tetrafluoropropanol or 2,2,3,3,4,4,5,5-octafluoropentanol is preferred, and 2,2,2-trifluoroethanol is more preferred, from such a viewpoint that it can be brought to a supercritical state at a relatively low temperature, or the solubility of a resist can be improved by a smaller amount of addition.

The combination of the fluorinated compound and the fluorinated alcohol to be used for the above solvent is not particularly limited. However, the following combinations may, for example, be preferred.

(1) 1,1,2,2-tetrafluoro-1-(2,2,2-trifluoroethoxy)ethane and 2,2,2-trifluoroethanol (2) 1,1,2,2-tetrafluoro-1-(2,2,2-trifluoroethoxy)ethane and 2,2,3,3-tetrafluoropropanol (3) 1,1,2,2-tetrafluoro-1-(2,2,2-trifluoroethoxy)ethane and 2,2,3,3,4,4,5,5-octafluoropentanol In a case where the fluorinated compound and the fluorinated alcohol are in the above-mentioned combination, the above fluorinated compound and the above fluorinated alcohol are mutually soluble, whereby a high washing effect can be obtained.

Particularly, when mixed in the following proportions, 1,1,2,2-tetrafluoro-1-(2,2,2-trifluoroethoxy)ethane and 2,2,2-trifluoroethanol will form an azeotropic composition or a composition (azeotrope-like composition) close to an azeotropic composition. Such an azeotropic composition or an azeotrope-like composition is free from a possibility that only one of components will be evaporated and disappear, and it is thereby possible to suppress an influence by the storage condition or the condition of use and it is possible to provide constant properties. Particularly in a case where the above solvent is used in a supercritical state, the above solvent is preferably an azeotropic composition or an azeotrope-like composition.

With respect to the mixing ratio of the above fluorinated compound and the above fluorinated alcohol, they are preferably mixed in a ratio to form an azeotropic composition or an azeotrope-like composition.

Further, the content of the above fluorinated alcohol is preferably at most 60 mass %, more preferably at most 30 mass %, in the composition, since the surface tension of the composition will not be too large, and the composition is capable of penetrating into pore portions of a pattern and capable of removing a resist remaining in the pore portions. Further, the content of the fluorinated alcohol is preferably at least 1 mass %, more preferably at least 5 mass %, in the composition from such a viewpoint that the composition thereby has an excellent washing effect with a good solubility of a contaminant substance made of a polar substance such as a resist residue.

Accordingly, as a combination of the above fluorinated compound and the above fluorinated alcohol, it is preferred that the content of the fluorinated alcohol in the composition will be from 1 to 60 mass %, and the composition becomes an azeotropic composition or an azeotrope-like composition.

Such a solvent is preferably a composition comprising 1,1,2,2-tetrafluoro-1-(2,2,2-trifluoroethoxy)ethane and 2,2,2-trifluoroethanol, wherein the mass ratio of the above 1,1,2,2-tetrafluoro-1-(2,2,2-trifluoroethoxy)ethane to the above 2,2,2-trifluoroethanol is from 70/30 to 95/5, whereby the composition can be an azeotrope-like composition.

Further, the mass ratio of the above 1,1,2,2-tetrafluoro-1-(2,2,2-trifluoroethoxy)ethane to the above 2,2,2-trifluoroethanol is more preferably 89/11, whereby the composition will be an azeotropic composition.

The above solvent may contain compounds other than the above fluorinated compound and the above fluorinated alcohol, within a range not to impair the purpose of the present invention.

As such other compounds, fluorinated compounds other than the above-mentioned ones may, for example, be mentioned.

As such fluorinated compounds other than the above-mentioned ones, a hydrochlorofluorocarbon such as dichloropentafluoropropane or dichlorofluoroethane, a fluorinated ketone, a fluorinated ester, a fluorinated ansaturated compound, and a fluorinated aromatic compound, may, for example, be mentioned. They may be used alone or in combination as a mixture of two or more of them.

The content of such fluorinated compounds in the above solvent is preferably at most 20 mass %, more preferably at most 10 mass %, further preferably at most 5 mass %.

The above solvent may further contain the following compounds for the purpose of mainly increasing the stability. Their content is preferably from 0.001 to 5 mass % in the composition. As such compounds, a nitro compound such as nitromethane, nitroethane, nitropropane or nitrobenzene; an amine such as diethylamine, triethylamine, isopropylamine or n-butylamine; a phenol such as phenol, o-cresol, m-cresol, p-cresol, thymol, p-t-butylphenol, t-butylcatechol, catechol, isoeugenol, o-methoxyphenol, bisphenol A, isoamyl salicylate, benzyl salicylate, methyl salicylate or 2,6-di-t-butyl-p-cresol; and a triazole such as 2-(2'-hydroxy-5'-methylphenyl)benzotriazole, 2-(2'-hydroxy-3'-t-butyl-5'-methylphenyl)-5-chlorobenzotriazole, 1,2,3-benzotriazole or 1-[(N,N-bis-2-ethylhexyl)aminomethyl]benzotriazole, may be mentioned. They may be used alone or in combination as a mixture of two or more of them.

The method for preparing the above solvent is not particularly limited, and for example, the above solvent may be obtained by stirring the above fluorinated compound and the above fluorinated alcohol, if necessary together with the above-mentioned optional compounds.

The above solvent has a small surface tension and yet comprises the above fluorinated compound and the above fluorinated alcohol having a high polarity, and therefore, the washing method of the present invention employing such a solvent as a wash solution, is capable of dissolving a resist made of polar molecules (particularly an acrylic resin type ArF resist) and capable of sufficiently removing a resist attached to a device substrate, particularly a resist attached to fine pore portions of a pattern having a large aspect ratio.

The washing method of the present invention comprises a washing step of removing a resist attached to a device substrate by means of the above-described solvent.

In the above washing step, washing of a device substrate can be carried out in the same manner as a known method for washing a device substrate except that the above-described solvent is employed. For example, a device substrate having a resist attached thereto is immersed in a washing container containing the above solvent, for a prescribed time, to remove the resist.

The temperature of the solvent during the immersion is not particularly limited, but for example, it is preferably from −10 to 100° C.

Further, the immersion time is not particularly limited. Usually, however, a sufficient washing effect can be obtained if the device substrate is immersed for about 10 minutes at room temperature. Thus, according to the washing method of the present invention, removal of a resist can be carried out in a relatively shorter time than the washing method employing a conventional wash solution.

In this step, ultrasonic waves may be applied, as the case requires, for the purpose of increasing the washing effect.

It is one of preferred embodiments to use the above solvent in a supercritical state in the above washing step. Specifically, in the above washing step, it is preferred that after washing is carried out by using the above solvent in a liquid state, washing is further carried out by using the above solvent in a supercritical state. Otherwise, in a container containing the device substrate, the above solvent preliminarily brought to a supercritical state is directly sealed for washing.

Here, a supercritical state means a phase state to be formed at a temperature and pressure of at least the critical temperature and critical pressure specific to the fluid substance. A fluid substance in a supercritical state (a supercritical fluid) has a characteristic such that the viscosity is extremely small and the diffusion is extremely large despite the is dissolving power to other liquid or solid is substantially equal to the liquid state of the substance.

By using the above solvent in a supercritical state in the above washing step, the surface tension becomes small, and the diffusion becomes extremely large as compared with a case where it is used in a liquid state, whereby the solvent tends to be easily penetrated into pore portions of a pattern. Accordingly, the washing effect becomes high, and it becomes possible to remove a resist remaining in fine pore portions of a pattern.

The method of bringing the above solvent in a supercritical state is not particularly limited, and a known method may be used.

As the method for washing a device substrate wherein the above solvent is used in a supercritical state, a method may, for example, be mentioned wherein the above solvent in a liquid state and the device substrate are put in a container to immerse the device substrate in the solvent, then the temperature and pressure are increased to at least the critical temperature and critical pressure of the above solvent to make the above solvent to be a critical fluid thereby to remove a resist.

The washing method of the present invention preferably further includes, after the above washing step, a rinsing step of carrying out rinsing by means of the above solvent or a hydrofluoroether. In a case where such a rinsing step is included, a higher washing effect can be obtained.

The above rinsing step may be carried out in the same manner as the above washing step, and the above solvent or a hydrofluoroether may be used in a supercritical state.

In the washing method of the present invention, after the above washing step, or after the above rinsing step which is carried out as the case requires, a drying step of drying the device substrate can be carried out.

A resist to be removed by the washing method of the present invention is not particularly limited. Specifically, such a resist may, for example, be an i-line resist made of a novolac resin as the basic skeleton, a KrF resist made of a polyvinyl phenol resin as the basic skeleton, an acrylic resin type ArF resist having an aliphatic polycyclic skeleton as the basic structure.

Here, the acrylic resin type ArF resist is a resist comprising a polymer (an acrylic resin) having substituents to impart various functions in side chains, which is obtained by polymerizing (meth)acrylic acid and/or a (meth)acrylic acid derivative, and a photoacid generator (PAG) capable of generating an acid under irradiation with an argon fluoride (ArF) laser. Specifically, the monomer as a raw material for the above acrylic resin may, for example, be preferably a monomer of the following formula (2):

In the above formula (2), $R^1$ is a hydrogen atom or a methyl group, and $R^2$ is a methyl group, a t-butyl group, a cyclohexyl group, a group of the following formula (3) or a group of the following formula (4).

(3)

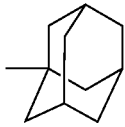

(4)

Specifically, the above photoacid generator (PAG) may, for example, be L-16388 ($^-N(SO_2CF_3)_2$), L-13858 ($^-N(SO_2C_2F_5)_2$), L-16175A ($^-N(SO_2C_4F_9)_2$) or L-18352 ($^-N(SO_2CF_3)_3$), manufactured by 3M.

The above-mentioned ArF resist having an aliphatic polycyclic skeleton as the basic structure may, for example, be a resist comprising a polymer having substituents to impart various functions in side chains, which is obtainable by alternately copolymerizing a cycloalkene such as norbornene and maleic anhydride, and the above-mentioned photoacid generator. Specifically, the polymer to be used for this resist may, for example, be preferably a polymer of the following formula (5) or (6):

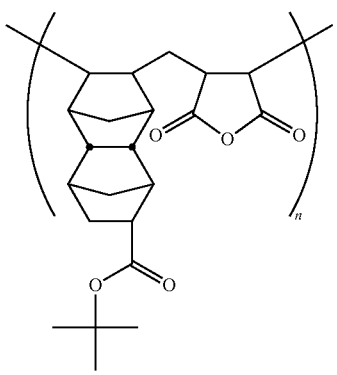

(5)

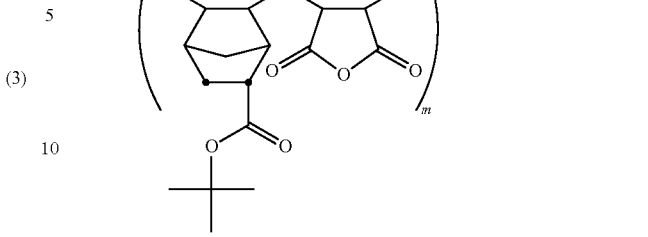

(6)

In the above formulae, each of n and m is an integer of from 10 to 5,000.

The above-described washing method of the present invention is capable of sufficiently removing a resist attached to a device substrate, particularly a resist attached to pore portions of a pattern having a large aspect ratio. Accordingly, it is useful for the production of a high performance device such as MEMS or LSI.

EXAMPLES

Now, the present invention will be described in detail with reference to Examples. However, it should be understood that the present invention is by no means restricted thereto.

1. Resist Solubility Test (Evaluation of Washing Effects)

Examples 1 to 3 and Comparative Examples 1 to 9

The respective components shown in the following Table 1 were mixed to have a composition (parts by mass) shown in Table 1 by means of a stirrer, to obtain each solvent shown in Table 1.

With respect to each solvent thereby obtained, the solubility of a resist was evaluated by the following method.

On a silicon wafer, an acrylic resin type ArF resist (TARF, manufactured by Tokyo Ohka Kogyo Co., Ltd.) was spin-coated and then baked for one hour in an oven of 120° C. to form a resist thin film having a film thickness shown in the following Table 1 (resist film thickness (before test) in Table 1), which was cut into 10 mm×30 mm to obtain a test specimen.

This test specimen was immersed in each solvent shown in Table 1 and left to stand at 30° C. for 10 minutes, whereupon the test specimen was taken out and dried at 120° C. for one hour.

The film thicknesses of the resist layers before and after the above treatment were measured by F20 optical thin film measuring apparatus (manufactured by Filmetrics), whereupon the film thickness change ($\Delta T$) was obtained to evaluate the resist solubility in each solvent.

The results are shown in Table 1.

TABLE 1

|  | Ex. 1 | Ex. 2 | Ex. 3 |
| --- | --- | --- | --- |
| $CHF_2CF_2OCH_2CF_3$ | 89 | 85 | 74 |
| $CF_3CH_2OH$ | 11 |  |  |
| $CHF_2CF_2CH_2OH$ |  | 15 |  |
| $CHF_2(CF_2)_3CH_2OH$ |  |  | 26 |
| Resist film thickness (before test) (nm) | 728 | 710 | 746 |
| Resist film thickness (after test) (nm) | <40 | <40 | <40 |
| $\Delta T$ (nm) | >688 | >670 | >706 |

TABLE 1-continued

|  | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|
| $CHF_2CF_2OCH_2CF_3$ | 80 | 80 | 80 | 80 | 80 | 80 | 80 | 80 | 80 |
| Ethyl acetate | 20 | | | | | | | | |
| Butyl acetate | | 20 | | | | | | | |
| Ethyl lactate | | | 20 | | | | | | |
| Diethyl phthalate | | | | 20 | | | | | |
| N-methyl-2-pyrolidinone | | | | | 20 | | | | |
| Diethylene glycol diethyl ether | | | | | | 20 | | | |
| 2-Heptanone | | | | | | | 20 | | |
| Methyl lactate | | | | | | | | 20 | |
| Diethyl carbonate | | | | | | | | | 20 |
| Resist film thickness (before test) (nm) | 727 | 726 | 731 | 723 | 719 | 707 | 728 | 720 | 723 |
| Resist film thickness (after test) (nm) | 725 | 825 | 726 | 715 | 713 | 702 | 725 | 718 | 716 |
| ΔT (nm) | 2 | 1 | 5 | 8 | 6 | 5 | 3 | 2 | 7 |

The fluorinated compound and the respective fluorinated alcohols shown in the above Table 1 are as follows.
$CHF_2CF_2OCH_2CF_3$: 1,1,2,2-tetrafluoro-1-(2,2,2-trifluoroethoxy)ethane
$CF_3CH_2OH$: 2,2,2-trifluoroethanol
$CHF_2CF_2CH_2OH$: 2,2,3,3-tetrafluoropropanol
$CHF_2(CF_2)_3CH_2OH$: 2,2,3,3,4,4,5,5-octafluoropentanol As is evident from the results shown in the above Table 1, the solvents in Comparative Examples 1 to 9 were not capable of substantially dissolving the resist. Whereas, the solvent comprising the fluorinated compound and the fluorinated alcohol (Examples 1 to 3) was remarkably superior in the solubility of the resist therein.

2. Measurement of Critical Points

With respect to each of three types of hydrofluoroethers having relatively low global warming potentials and the solvent in Example 1, the critical temperature and the critical pressure were measured by transmitted light intensity measurement by means of a high pressure optical cell. Specifically, each solvent shown in Table 2 was put into a high pressure optical cell, and then, the temperature and pressure were raised, whereby the temperature and pressure when the transmitted light intensity changed, were measured.

The results are shown in Table 2.

TABLE 2

| Solvent | Critical temperature (° C.) | Critical pressure (atm) |
|---|---|---|
| $CHF_2CF_2OCH_2CF_3$ | 191 | 25.8 |
| $CF_3CHFCF_2OCH_2CF_3$ | 197 | 21.8 |
| $CF_3CHFCF_2OCH_2CF_2CF_3$ | 203 | 18.5 |
| Solvent in Example 1 | 191 to 195 | 28 to 30 |

As is apparent from the results shown in Table 2, the solvent in Example 1 had a critical temperature of at most 200° C. and a critical pressure of at most 30 atm and thus was found to be relatively easily made into a supercritical fluid. Further, it was found that each hydrofluoroether shown in Table 2 was relatively easily made into a supercritical fluid like the solvent in Example 1 and thus is suitable as the above fluorinated compound.

3. Measurement of Gas-Liquid Equilibrium

Using an Othmer-Type gas-liquid equilibrium measuring apparatus, the gas-liquid equilibrium and the azeotropic points of 1,1,2,2-tetrafluoro-1-(2,2,2-trifluoroethoxy)ethane and 2,2,2-trifluoroethanol were measured. A mixture having a compositional ratio of 1,1,2,2-tetrafluoro-1-(2,2,2-trifluoroethoxy)ethane and 2,2,2-trifluoroethanol as disclosed in the column for "at the time of charging" in the following Table 3, was put in a sample container, and heating was initiated. Thereafter, heating was adjusted so that a dropping rate of the gas phase condensed liquid would be proper, and constant boiling was maintained for two hours, and after confirming that the pressure and the boiling point were stable, liquids in the liquid phase and gas phase sides were analyzed by gas chromatograph, and the compositional ratios of 1,1,2,2-tetrafluoro-1-(2,2,2-trifluoroethoxy)ethane in the respective phases (liquid phase and gas phase) were measured. The results are shown in Table 3.

TABLE 3

| At the time of charging $CHF_2CF_2OCH_2CF_3$ compositional ratio (%) | After boiling for two hours | |
|---|---|---|
| | Liquid phase $CHF_2CF_2OCH_2CF_3$ compositional ratio (x in %) | Gas phase $CHF_2CF_2OCH_2CF_3$ compositional ratio (y in %) |
| 100 | 100 | 100 |
| 99.6 | 99.67 | 99.19 |
| 99.4 | 99.49 | 98.75 |
| 99.2 | 99.28 | 98.25 |
| 97.5 | 97.65 | 94.86 |
| 95.9 | 96.10 | 94.14 |
| 95.5 | 95.72 | 93.70 |
| 95.0 | 95.18 | 93.27 |
| 94.5 | 94.74 | 92.62 |
| 94.4 | 94.47 | 92.54 |
| 93.9 | 94.01 | 92.09 |
| 88.8 | 88.91 | 89.03 |
| 88.3 | 88.27 | 88.50 |
| 86.2 | 86.00 | 87.99 |
| 85.6 | 85.02 | 87.90 |
| 85.7 | 84.99 | 87.63 |

The azeotropic composition was obtained from the intersecting point of a linear line (y=x) connecting points where the compositions of the gas phase and the liquid phase become equal, with a curve obtained by plotting the results shown in Table 3 by taking the compositional ratio (x in %) of 1,1,2,2-tetrafluoro-1-(2,2,2-trifluoroethoxy)ethane in the liquid phase on the abscissa axis and the compositional ratio (y in %) of 1,1,2,2-tetrafluorol-(2,2,2-trifluoroethoxy)ethane in the gas phase on the ordinate axis.

As a result, it was found that a composition wherein the mass ratio of 1,1,2,2-tetrafluoro-1-(2,2,2-trifluoroethoxy)ethane to 2,2,2-trifluoroethanol is 89/11, becomes an azeotropic composition.

4. Washing Test

Example 4

On a silicon substrate, an acrylic resin type ArF resist (TARF manufactured by Tokyo Ohka Kogyo Co., Ltd.) was spin-coated and then baked for one hour in an oven of 120° C. to form a resist thin film having a thickness of 700 nm, and a resist pattern with a width of from 50 to 300 nm was formed by a known electron lithography, and the silicon layer was subjected to etching with chlorine plasma.

Then, the substrate was transferred to a container which can be hermetically sealed, and the interior of the container was filled with the above-described solvent of Example 1, followed by washing for 10 minutes under conditions of atmospheric pressure at 30° C. Further, the temperature was raised to 220° C., and the container was sealed, whereupon the pressure in the container was adjusted to 3 MPa by a back-pressure valve to bring the solvent to a supercritical state, followed by washing for 10 minutes.

Thereafter, while the temperature was maintained to be constant, the solvent in a supercritical state was discharged, and the substrate was taken out from the container. With respect to this substrate, quantitative determination of the carbon content was carried out by a depth profile measurement by means of an electron spectroscopy for chemical analysis (ESCA), whereby it was found that the resist contamination attached not only to the substrate surface but also to pore portions of the pattern on the substrate was sufficiently removed, thus presenting an excellent washed surface.

Example 5

On a silicon substrate, a low dielectric constant film of hydrogen silsesquioxane (HSQ OCD T-9, manufactured by Tokyo Ohka Kogyo Co., Ltd.) having a thickness of 560 nm was formed. On this film, an acrylic resin type ArF resist (TARF, manufactured by Tokyo Ohka Kogyo Co., Ltd.) was spin-coated and then baked for one hour in an oven of 120° C. to form a resist thin film having a thickness of 700 nm, whereupon a hole pattern having an average width of 90 nm was formed by photolithography, and the low dielectric constant film was subjected to etching with a mixed gas plasma of $CHF_3$ and argon.

Thereafter, the substrate was transferred to a container which can be hermetically sealed, and the interior of the container was filled with the above-described solvent of Example 1, followed by washing for 10 minutes under conditions of atmospheric pressure at 30° C. Further, the temperature was raised to from 200 to 250° C., and the container was hermetically sealed, whereupon the pressure in the container was adjusted to 3 MPa by a back-pressure valve, and the cover portion of the container was set to be within a range of from 150 to 200° C. to bring the solvent in a supercritical state, followed by washing for 10 minutes.

Thereafter, while the temperature was maintained to be constant, the solvent in a supercritical state was discharged, and the substrate was taken out from the container. With respect to this substrate, quantitative determination of the carbon content was carried out by a depth profile measurement by means of an electron spectroscopy for chemical analysis (ESCA), whereby it was found that the resist contamination not only on the substrate surface, but also in fine pores of the low dielectric constant film was sufficiently removed, thus presenting an excellent washed surface.

Example 6

On a silicon substrate, a low dielectric constant film of hydrogen silsesquioxane (HSQ OCD T-9, manufactured by Tokyo Ohka Kogyo Co., Ltd.) having a thickness of 560 nm was formed. On this film, an acrylic resin type ArF resist (TARF, manufactured by Tokyo Ohka Kogyo Co., Ltd.) was spin-coated and then baked for one hour in an oven of 120° C. to form a resist thin film having a thickness of 700 nm, whereupon a hole pattern having an average width of 90 nm was formed by photolithography, and the low dielectric constant film was subjected to etching with a mixed gas plasma of $CHF_3$ and argon.

Thereafter, the substrate was transferred to a container which can be hermetically sealed, and the solvent of Example 1 which was preliminarily brought to a supercritical state, was introduced into the container, followed by washing for 10 minutes. Then, while the temperature was maintained to be constant, the solvent in the supercritical state was discharged. Further, 1,1,2,2-tetrafluoro-1-(2,2,2-trifluoroethoxy)ethane in a supercritical state was introduced for rinsing. Then, while the temperature was maintained to be constant, the solvent in the supercritical state was discharged, and the substrate was taken out from the container. With respect to this substrate, quantitative determination of the carbon content was carried out by a depth profile measurement by means of an electron spectroscopy for chemical analysis (ESCA), whereby it was found that the resist contamination not only on the substrate surface, but also in fine pores of the low dielectric constant film was sufficiently removed, thus presenting an excellent washed surface.

INDUSTRIAL APPLICABILITY

The method for washing a device substrate of the present invention is capable of sufficiently removing a resist attached to a device substrate, whereby it is useful for the production of common devices. Further, it is particularly excellent in removal of a resist attached to fine pore portions of a pattern having a large aspect ratio, whereby it is useful for the production of high performance devices, such as MEMS, LSI, etc.

The entire disclosure of Japanese Patent Application No. 2006-104187 filed on Apr. 5, 2006 including specification, claims and summary is incorporated herein by reference in its entirety.

What is claimed is:

1. A method for washing a device substrate, which comprises removing an acrylic resin ArF resist attached to a device substrate by washing said device substrate with a solvent, wherein the solvent is a composition comprising at least one fluorinated compound selected from the group consisting of a hydrofluoroether, a hydrofluorocarbon, and a perfluorocarbon, and a fluorinated alcohol.

2. The method for washing a device substrate according to claim 1, wherein the fluorinated compound is a hydrofluoroether.

3. The method for washing a device substrate according to claim 2, wherein the hydrofluoroether is 1,1,2,2-tetrafluoro-1-(2,2,2-trifluoroethoxy)ethane.

4. The method for washing a device substrate according to claim 1, wherein the fluorinated alcohol is a compound of the following formula (1): $C_aH_bF_dX_eOH$ (1) wherein X is a halogen atom other than a fluorine atom, each of a and d is an integer of at least 1, and each of b and e is an integer of at least 0, provided that b+d+e=2a+1.

5. The method for washing a device substrate according to claim 4, wherein the fluorinated alcohol is 2,2,2-trifluoroethanol.

6. The method for washing a device substrate according to claim 1, wherein the content of the fluorinated alcohol is from 1 to 60 mass % in the composition.

7. The method for washing a device substrate according to claim 1, wherein the solvent is a composition comprising 1,1,2,2-tetrafluoro-1-(2,2,2-trifluoroethoxy)ethane and 2,2,2-trifluoroethanol, wherein the mass ratio of the 1,1,2,2-tetrafluoro-1-(2,2,2-trifluoroethoxy)ethane to the 2,2,2-trifluoroethanol is from 70/30 to 95/5.

8. The method for washing a device substrate according to claim 7, wherein the mass ratio of the 1,1,2,2-tetrafluoro-1-(2,2,2-trifluoroethoxy)ethane to the 2,2,2-trifluoroethanol is 89/11.

9. The method for washing a device substrate according to claim 1, wherein the solvent is a composition comprising 1,1,2,2-tetrafluoro-1-(2,2,2-trifluoroethoxy)ethane and 2,2,3,3-tetrafluoropropanol.

10. The method for washing a device substrate according to claim 1, wherein the solvent is a composition comprising 1,1,2,2-tetrafluoro-1-(2,2,2-trifluoroethoxy)ethane and 2,2,3,3,4,4,5,5-octafluoropentanol.

11. The method for washing a device substrate according to claim 1, wherein the solvent is used in a supercritical state.

12. The method for washing a device substrate according to claim 1, wherein the washing is first carried out by using the solvent in a liquid state, and then washing is carried out by using the solvent in a supercritical state.

13. The method for washing a device substrate according to claim 1, which includes, after the washing, rinsing with the above solvent or a hydrofluoroether.

14. The method for washing a device substrate according to claim 1, wherein the acrylic resin ArF resist comprises an aliphatic polycyclic skeleton.

15. The method for washing a device substrate according to claim 1, wherein the acrylic resin ArF resist comprises an acrylic resin which is obtained by a process comprising polymerizing (meth)acrylic acid and/or a (meth)acrylic acid derivative, and a photoacid generator (PAG) capable of generating an acid under irradiation with an argon fluoride (ArF) laser.

16. The method for washing a device substrate according to claim 1, wherein the acrylic resin ArF resist comprises an acrylic resin obtained by a process comprising polymerizing a monomer of the following formula (2):

(2)

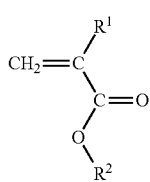

wherein $R^1$ is a hydrogen atom or a methyl group, and $R^2$ is a methyl group, a t-butyl group, a cyclohexyl group, a group of the following formula (3) or a group of the following formula (4)

(3)

(4)

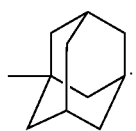

17. The method for washing a device substrate according to claim 15, wherein the photoacid generator (PAG) is selected from the group consisting of $^-N(SO_2CF_3)_2$, $^-N(SO_2C_2F_5)_2$, $^-N(SO_2C_4F_9)_2$ and $^-N(SO_2CF_3)_3$.

18. The method for washing a device substrate according to claim 1, wherein the acrylic resin ArF resist comprises a polymer obtained by a process comprising alternately copolymerizing a cycloalkene and maleic anhydride, and a photoacid generator.

19. The method for washing a device substrate according to claim 1, wherein the acrylic resin ArF resist comprises a polymer represented by formula (5) or (6)

(5)

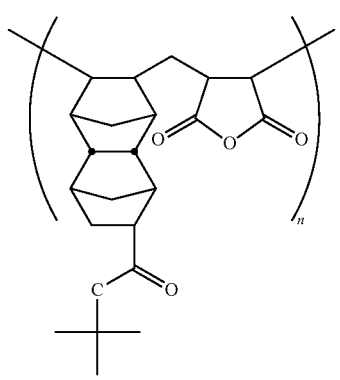

(6)

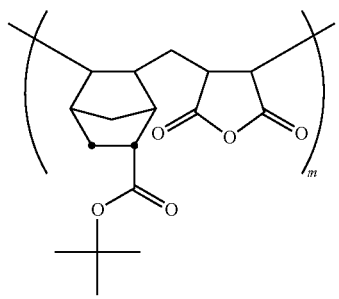

wherein each of n and m is an integer of from 10 to 5,000.

20. The method for washing a device substrate according to claim 18, wherein the cycloalkene is norbornene.

* * * * *